US012584979B2

(12) United States Patent
Chu et al.

(10) Patent No.: US 12,584,979 B2
(45) Date of Patent: Mar. 24, 2026

(54) SURFACE COILS AND MAGNETIC RESONANCE DEVICES

(71) Applicant: SHANGHAI UNITED IMAGING HEALTHCARE CO., LTD., Shanghai (CN)

(72) Inventors: Dashen Chu, Shanghai (CN); Shihao Chen, Shanghai (CN); Shang Xu, Shanghai (CN); Yunlei Yao, Shanghai (CN); Hai Lu, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 159 days.

(21) Appl. No.: 18/401,372

(22) Filed: Dec. 30, 2023

(65) Prior Publication Data

US 2024/0219492 A1      Jul. 4, 2024

(30) Foreign Application Priority Data

Dec. 30, 2022    (CN) ......................... 202211733223.X
Mar. 8, 2023    (CN) .......................... 202310224452.7

(51) Int. Cl.
*G01R 33/34*        (2006.01)

(52) U.S. Cl.
CPC .............................. *G01R 33/34092* (2013.01)

(58) Field of Classification Search
CPC ........ G01R 33/34092; G01R 33/34007; G01R 33/3621; G01R 33/3628; G01R 33/3657; G01R 33/3685; G01R 33/3415
See application file for complete search history.

(56) References Cited

U.S. PATENT DOCUMENTS

| | | |
|---|---|---|
| 10,690,737 B2 | 6/2020 | Yang et al. |
| 10,921,399 B2 | 2/2021 | Hushek et al. |
| 10,969,447 B2 | 4/2021 | Stack et al. |
| 10,983,185 B2 | 4/2021 | Stack et al. |
| 11,280,859 B2 | 3/2022 | Dalveren et al. |
| 11,360,168 B2 | 6/2022 | Taracila et al. |
| 11,402,447 B2 | 8/2022 | Fuqua et al. |

(Continued)

FOREIGN PATENT DOCUMENTS

EP        3545322 B1    5/2022

OTHER PUBLICATIONS

Quarter-wave Impedance transformer in Wikipedia (Year: 2009).*

*Primary Examiner* — G.M. A Hyder
(74) *Attorney, Agent, or Firm* — METIS IP LLC

(57)        ABSTRACT

The present disclosure provides surface coils and magnetic resonance devices. The surface coil may include: a radio frequency coil, a transmission line, and a preamplifier. The radio frequency coil may include at least one coil unit, the at least one coil unit receiving a magnetic resonance signal. One end of the transmission line may be connected to the radio frequency coil, another end of the transmission line may extend out of the radio frequency coil and may be connected to the preamplifier, and the transmission line may be configured to perform impedance transformations between the radio frequency coil and the preamplifier and transmit the magnetic resonance signal received by the radio frequency coil to the preamplifier. The preamplifier may receive and amplify the magnetic resonance signal received by the radio frequency coil.

17 Claims, 8 Drawing Sheets

(56) References Cited

U.S. PATENT DOCUMENTS

| | | | |
|---|---|---|---|
| 11,428,762 B2 | 8/2022 | Taracila et al. | |
| 2001/0045832 A1* | 11/2001 | Belt ................... | G01R 33/3415 |
| | | | 324/318 |
| 2007/0219443 A1* | 9/2007 | Ehnholm ............... | G01R 33/28 |
| | | | 600/414 |
| 2018/0238987 A1* | 8/2018 | Chu ................... | G01R 33/3664 |
| 2018/0372817 A1 | 12/2018 | Rahmat-Samii et al. | |
| 2019/0310330 A1 | 10/2019 | Yang et al. | |
| 2019/0310331 A1 | 10/2019 | Otake et al. | |
| 2020/0081081 A1 | 3/2020 | Yang et al. | |
| 2020/0233048 A1* | 7/2020 | Corea ...................... | H03H 3/00 |
| 2020/0271738 A1 | 8/2020 | Qin et al. | |

* cited by examiner

120

124

122

SURFACE COILS AND MAGNETIC RESONANCE DEVICES

CROSS-REFERENCE TO RELATED APPLICATION

This application claims priority to Chinese Patent Application No. 202211733223.X, filed on Dec. 30, 2022 and Chinese Patent Application No. 202310224452.7, filed on Mar. 8, 2023, the entire contents of each of which are hereby incorporated by reference.

TECHNICAL FIELD

The present disclosure relates to magnetic resonance technology, and in particular, to surface coils and magnetic resonance devices.

BACKGROUND

A surface coil is widely used in magnetic resonance imaging due to a high signal-to-noise ratio, which is brought by a high degree of fit of a surface of an imaging target body relative to the surface coil.

However, some rigid discrete radio frequency (RF) devices (e.g., a Printed circuit board (PCB) and discrete electronic components such as capacitors or inductors configured to perform tuning and impedance matching) of the surface coil may still not only affect the degree of fit between the surface coil and the surface of the imaging target body, but also affect B0 homogeneity especially as field strength increase, which may affect the image quality.

Therefore, it is desirable to provide surface coils without discrete RF components and corresponding supporting PCBs to further improve fit and hence signal-to-noise ratio (SNR) as well as to reduce or remove unwanted B0 distortions induced by the existence of the PCBs.

SUMMARY

One of the embodiments of the present disclosure provides a surface coil. The surface coil may include: a radio frequency coil, a transmission line, and a preamplifier. The radio frequency coil may include at least one coil unit, the at least one coil unit receiving a magnetic resonance signal. One end of the transmission line may be connected to the radio frequency coil, another end of the transmission line may extend out of the radio frequency coil and may be connected to the preamplifier, and the transmission line may be configured to perform impedance transformations between the radio frequency coil and the preamplifier and transmit the magnetic resonance signal received by the radio frequency coil to the preamplifier. The preamplifier may receive and amplify the magnetic resonance signal received by the radio frequency coil.

In some embodiments, the radio frequency coil may include a flexible conductive wire. The flexible conductive wire may surround and form the at least one coil unit.

In some embodiments, the flexible conductive wire may include at least one tuning transmission segment. The at least one tuning transmission segment may be equivalent to a tuning capacitor and/or a tuning inductance.

In some embodiments, a length of the transmission line may be an odd multiple of a quarter wavelength. A wavelength may be a wavelength of the magnetic resonance signal transmitted in the transmission line.

In some embodiments, a characteristic impedance of the transmission line may be used to perform impedance transformations between the output of a coil and the input of the preamplifier of the surface coil.

In some embodiments, the flexible conductive wire may include at least one of a coaxial wire, a microstrip wire, or a twisted pair wire.

In some embodiments, the flexible conductive wire may include a core wire and a ground wire, and the tuning transmission segment may include a first transmission segment equivalent to the tuning capacitor and/or a second transmission segment equivalent to the tuning inductance. The core wire in the first transmission segment may be conducted, and the ground wire may be disconnected; or the core wire in the second transmission segment may be disconnected, and the ground wire may be conducted.

In some embodiments, the at least one coil unit may include a plurality of coil units, the transmission line may include a wave trap, and output ends of the plurality of coil units may be coupled with a plurality of preamplifiers through the wave trap.

In some embodiments, the surface coil may further include at least one diode. The radio frequency coil may be controlled to be in a detuning state through conduction of the at least one diode, or the radio frequency coil may be controlled to be in a tuning state through disconnection of the at least one diode. A positive pole of the at least one diode may be connected to an output end of the transmission line and a signal input end of the preamplifier, and a negative pole of the at least one diode may be grounded.

In some embodiments, the surface coil may further include a mounting layer and a cladding layer. The mounting layer and the cladding layer may be flexible. The radio frequency coil may be disposed on the mounting layer. The cladding layer may be disposed on the mounting layer and at least clads the radio frequency coil. The mounting layer and the cladding layer may penetrate through the surface coil along a thickness direction of the surface coil and form a hollow structure.

In some embodiments, the surface coil may further include an edge sealing structure in a shape of a ring. The edge sealing structure may be disposed along an edge of the hollow structure. The edge sealing structure may include a sealing part, a bonding zone, and a sewing part. The bonding zone may surround outside the edge of the hollow structure and bond the cladding layer and the mounting layer. The sealing part may be disposed along an inner edge of the bonding zone and may be hermetically connected to the cladding layer and the mounting layer. The sewing part may be disposed along an outer edge of the bonding zone and may sew the cladding layer and the mounting layer.

In some embodiments, the radio frequency coil may include a plurality of tuning capacitors connected in series. The surface coil may further include a regulating control unit, the regulating control unit being connected to the another end of the transmission line. The regulating control unit may regulate the radio frequency coil to enter a tuning state or a detuning state according to a received direct current signal.

In some embodiments, the regulating control unit includes: a radio frequency choke, one end of the radio frequency choke receiving the direct current signal, and another end of the radio frequency choke being connected to the another end of the transmission line.

In some embodiments, the surface coil may include a plurality of radio frequency coils, and each radio frequency coil of the plurality of radio frequency coils may form an array structure. The surface coil may include a plurality of transmission lines, and one end of each transmission line of the plurality of transmission lines may be connected to an output end of each radio frequency coil in a one-to-one correspondence. The surface coil may include a plurality of regulating control units, and each regulating control unit of the plurality of regulating control units may be connected to another end of each transmission line in a one-to-one correspondence.

In some embodiments, two adjacent transmission lines of the plurality of transmission lines may be wound around each other to form a twisted pair wire.

In some embodiments, a length of each transmission line of the plurality of transmission lines may be an odd multiple of a quarter wavelength, a wavelength being a wavelength of the magnetic resonance signal transmitted in the transmission line. The surface coil may further include a plurality of shielding layers covering an outer surface of the each transmission line and a plurality of capacitors connected in parallel with the each transmission line in a one-to-one correspondence.

In some embodiments, the surface coil may further include: an insulating layer, the insulating layer wrapping an outer surface of the transmission line; and a plug connector, an input end of the plug connector being connected to the another end of each transmission line, and an output end of the plug connector outputting the magnetic resonance signal.

In some embodiments, the surface coil may include a plurality of the preamplifiers, an input end of each preamplifier of the plurality of preamplifiers may be connected to the another end of the each transmission line in a one-to-one correspondence. An output end of the each preamplifier may be connected to the input end of the plug connector.

In some embodiments, the surface coil may further include a plurality of phase shifters connected in series with the plurality of transmission lines in a one-to-one correspondence, and the plurality of phase shifters may compensate the plurality of transmission lines to make an equivalent electrical length of each transmission line be an odd multiple of a quarter wavelength.

In some embodiments, the magnetic resonance device may further include a plug connector. The plug connector may be connected between a transmission line of the surface coil and a signal input end of the preamplifier. The plug and the connected transmission line together may serve as an effective transmission line performing impedance transformations as long as the total equivalent wave length is an odd multiple of a quarter wavelength.

BRIEF DESCRIPTION OF THE DRAWINGS

The present disclosure is further illustrated in terms of exemplary embodiments. These exemplary embodiments are described in detail with reference to the drawings. These embodiments are non-limiting exemplary embodiments, in which like reference numerals represent similar structures, wherein.

DETAILED DESCRIPTION

Figure 1:
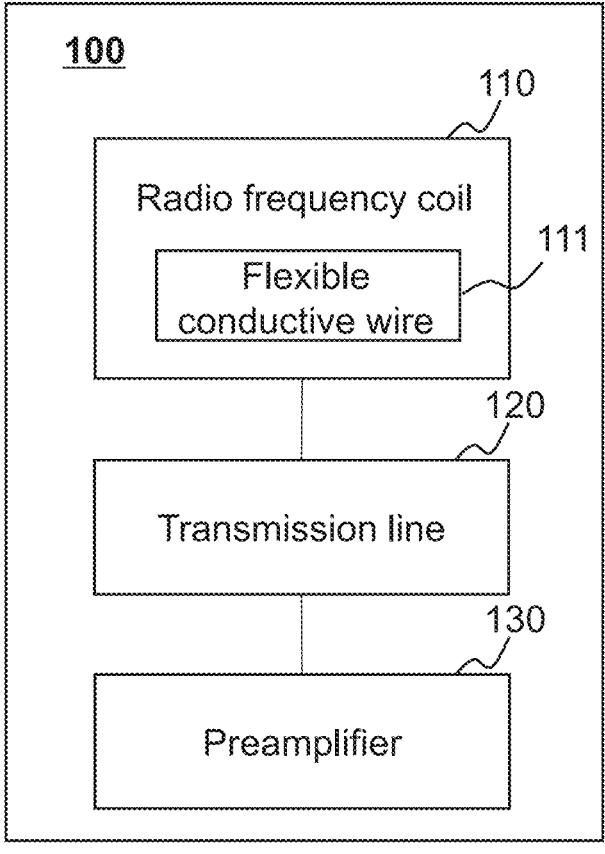
FIG. 1 is a block diagram illustrating a structure of a surface coil according to some embodiments of the present disclosure.

In order to more clearly illustrate the technical solutions related to the embodiments of the present disclosure, a brief introduction of the drawings referred to the description of the embodiments is provided below. Obviously, the drawings described below are only some examples or embodiments of the present disclosure. Those having ordinary skills in the art, without further creative efforts, may apply the present disclosure to other similar scenarios according to these drawings. Unless obviously obtained from the context or the context illustrates otherwise, the same numeral in the drawings refers to the same structure or operation.

It should be understood that the "system," "device," "unit," and/or "module" used herein are one method to distinguish different components, elements, parts, sections, or assemblies of different levels. However, if other words can achieve the same purpose, the words can be replaced by other expressions.

As used in the disclosure and the appended claims, the singular forms "a," "an," and "the" include plural referents unless the content clearly dictates otherwise; the plural forms may be intended to include singular forms as well. In general, the terms "comprise," "comprises," and/or "comprising," "include," "includes," and/or "including," merely prompt to include steps and elements that have been clearly identified, and these steps and elements do not constitute an exclusive listing. The methods or devices may also include other steps or elements.

The flowcharts used in the present disclosure illustrate operations that the system implements according to the embodiment of the present disclosure. It should be understood that the foregoing or following operations may not necessarily be performed exactly in order. Instead, the operations may be processed in reverse order or simultaneously. Besides, one or more other operations may be added to these processes, or one or more operations may be removed from these processes.

The present disclosure discloses a surface coil which is configured to receive the magnetic resonance signals. The surface coil may realize impedance matching of a circuit only by setting up a flexible transmission line, and there may be no need to additionally set up a rigid discrete radio frequency device (e.g., a Printed circuit board (PCB) and an electronic component configured to perform tuning and impedance matching), so that the radio frequency coil may also efficiently acquire the magnetic resonance signals, which may ensure that the surface coil is flexible and well fit with a surface of an imaging target body, avoid the human tissue that is fit to the surface coil from being squeezed and deformed, reduce the deformation of the radio frequency field (B1 field), and improve the imaging quality.

The surface coil involved in the embodiments of the present disclosure is described in detail below in connection with FIGS. 1-7D. It should be noted that the following embodiments are merely for illustrating the present disclosure and do not constitute a limitation of the present disclosure.

FIG. 1 is a block diagram illustrating a surface coil 100 according to some embodiments of the present disclosure. In some embodiments, as shown in FIG. 1, the surface coil 100 may include a radio frequency coil 110, a transmission line 120, and a preamplifier 130.

The radio frequency coil 110 may be a device that receives a radio frequency signal. The radio frequency coil 110 may be fit to human tissue to receive the magnetic resonance signal from the human tissue.

In some embodiments, the radio frequency coil 110 may include at least one coil unit 112, and the at least one coil unit 112 may receive a magnetic resonance signal. In some embodiments, the at least one coil units 112 in the radio frequency coil 110 may be one coil unit. That is, the coil unit 112 may be a single-channel coil, such as a local coil. In some embodiments, an output end of the coil unit 112 may be connected to a signal input end of the preamplifier 130, and another end of the coil unit 112 away from a signal output end may be grounded. In some embodiments, the coil unit 112 may receive one single magnetic resonance signal or may receive a plurality of magnetic resonance signals in a time-sharing manner. More descriptions regarding the one coil unit 112 may be found in FIGS. 3-6 below and the related descriptions thereof.

In some embodiments, the at least one coil units 112 in the radio frequency coil 110 may be a plurality of coil units 112. The plurality of coil units 112 may forms a partially parallel acquisition RF coil array. Output ends of the plurality of coil units 112 may be coupled with the transmission line 120 to transmit the magnetic resonance signal received by each coil unit of the plurality of coil units 112 to the preamplifier 130. Further, two ends of each of the plurality of coil units 112 may be coupled with the transmission line 120. In some embodiments, the plurality of coil units 112 may receive the plurality of magnetic resonance signals at the same time in order to improve imaging efficiency. In some embodiments, different coil units 112 may acquire different magnetic resonance signals corresponding to different human tissue. More descriptions regarding the plurality of coil units 112 may be found in FIG. 7A and FIG. 7B below and the related descriptions thereof.

It should be noted that for the traditional coil array soldered on the PCB, the conductor in the PCB is easy to follow the changing current in the imaging region to generate an induced current, which may seriously affect B0 homogeneity, which affects the imaging of the imaging region. Compared with the imaging region of the conventional coil array, the surface coil 100 may make the imaging region without the rigid discrete radio frequency device (e.g., the PCB and the electronic component configured to perform tuning and impedance matching) through the design of cooperation between the transmission line 120 and the radio frequency coil 110, which may reduce the effect of the eddy current on imaging. More descriptions regarding the design of cooperation between the transmission line 120 and the radio frequency coil 110 may be found in FIGS. 3-7D below and the related descriptions thereof.

In the embodiments of the present disclosure, the transmission line 120 may be designed to cooperate with the radio frequency coil 110, and the rigid discrete radio frequency device (e.g., the PCB and the electronic component configured to perform tuning and impedance matching) may not be disposed in the imaging region, which may improve the degree of fit with the human tissue and avoid the eddy current generated by the conductor in the PCB from affecting the imaging of the imaging region, thereby improving the imaging quality.

In some embodiments, the radio frequency coil 110 may include a flexible conductive wire 111. The flexible conductive wire 111 may surround and form the at least one coil unit 112.

The flexible conductive wire 111 refers to a cable having a degree of softness. In some embodiments, the flexible conductive wire 111 may surround and form the coil unit 112, so that the coil unit 112 may also have the degree of softness. For example, the softer the flexible conductive wire 111 is, the softer the imaging region in which the coil unit 112 is located may be, the easier the coil unit 112 may be fit to the human tissue, and the better the obtained imaging effect may be.

In some embodiments, the flexible conductive wire 111 may include a coaxial wire, a microstrip wire, a twisted pair wire, or any combination thereof. The flexible conductive wire 111 may also include other composite flexible conductive wires with a plurality of wires (e.g., a core and a ground).

The coaxial wire refers to a transmission cable consisting of two coaxial conductors. The microstrip wire refers to a transmission cable consisting of a strip of conductors supported on a dielectric substrate. The twisted pair wire refers to a transmission cable in which two conductors wrapped in an insulating and protective layer are twisted together with each other. In some embodiments, different composite flexible conductive wires may be selected as the flexible conductive wire 111 based on imaging needs. Exemplarily, in order to make the radio frequency coil flat to be fit to the human tissue and accurately acquire the magnetic resonance signal, the microstrip wire may be selected as the flexible conductive wire 111. As another example, in order to reduce the interference to the magnetic resonance signal in the acquisition process, the twisted pair wire may be selected as the flexible conductive wire 111.

In the embodiments of the present disclosure, the composite flexible conductive wire 111 may be selected, which may ensure the flexibility and reduce the interference of an interfering signal to the magnetic resonance signal through the cable structure, thereby further improving the imaging quality of the magnetic resonance signal.

The transmission line 120 refers to a cable that transmits electrical signals. In some embodiments, one end of the transmission line 120 may be connected to the radio frequency coil 110, and another end may extend out of the radio frequency coil 110 and be connected to a preamplifier 130, so that the magnetic resonance signal received by the radio frequency signal may be transmitted to the preamplifier 130.

In some embodiments, the transmission line 120 may perform impedance transformations between the radio frequency coil 110 and the preamplifier 130. For example, the transmission line 120 may be configured to perform dual impedance transformations. The transmission line 120 may transform an output impedance of the radio frequency coil 110 to a source impedance of the preamplifier 130. That is to say, even if different radio frequency coils 110 have different impedances, the impedance transformation may be performed through the transmission line 120 to make the preamplifier 130 reach an optimal source impedance, thereby improving signal-to-noise ratios of the different radio frequency coils 110. Meanwhile, the transmission line 120 may transform a low input impedance of the preamplifier 130 to a high impedance of the connected coils, which may minimize interference among RF coils of the coil array, thereby improving the overall SNR of the coil array.

In some embodiments, the transmission line 120 may include a wave trap, and the output ends of the plurality of coil units 112 may also be coupled with a plurality of preamplifiers 130 through the wave trap.

The wave trap refers to a resonant circuit structure that may be configured to eliminate an unwanted signal to minimize interference with a wanted signal. In some embodiments, the wave trap may be configured to filter out the interfering signal to improve the quality of an image corresponding to the plurality of magnetic resonance signals. It should be noted that the wave trap may be one implementation of the transmission line 120, and the transmission line 120 may be implemented in other ways. For example, the transmission line 120 may include an independently arranged section of transmission cable or an extension wire of the radio frequency coil 110.

In the embodiments of the present disclosure, the wave trap may be disposed at the output ends of the plurality of coil units 112, which may filter out the interfering signal, so that the plurality of coil units 112 may transmit the magnetic resonance signals corresponding to the coil units 112 to the preamplifiers corresponding to the coil units 112, respectively, which may reduce the interference to the signal during transmission, thereby improving the signal quality and the imaging quality of the signal.

Figure 2:
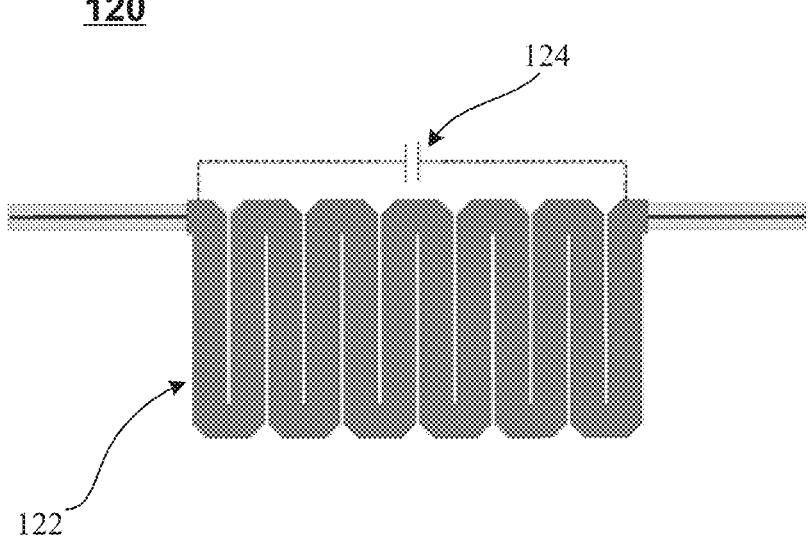
FIG. 2 is a schematic diagram illustrating a structure of a transmission line according to some embodiments of the present disclosure.

FIG. 2 is a schematic diagram illustrating a structure of a transmission line 120 according to some embodiments of the present disclosure. In some embodiments, as shown in FIG. 2, the wave trap may include a transmission line 122 and a capacitor 124 connected in parallel.

The transmission line 122 refers to the transmission line 120 in a serpentine winding shape, which may play a role of the transmission line 120. In some embodiments, the transmission line 122 may include a microstrip wire in a serpentine winding shape. More descriptions regarding the microstrip wire may be found in FIG. 3 below and the related description thereof.

In some embodiments, the transmission line 122 may be matched with the capacitor 124 to suppress a common-mode signal in a circuit through resonance. In some embodiments, a metal shield may also be added to the transmission line 122 to avoid interference of other electromagnetic signals to the acquired magnetic resonance signal. More descriptions regarding the wave trap may be found in FIG. 7C and FIG. 7D below and the related descriptions thereof.

In the embodiments of the present disclosure, the transmission line 120 and the capacitor may be connected in parallel, which may filter out the interfering signal by resonance, so as to ensure the transmission quality of the magnetic resonance signal and improve the quality of the image corresponding to the plurality of magnetic resonance signals.

In some embodiments, continue to refer to FIG. 1, the preamplifier 130 may receive and amplify the magnetic resonance signal received by the radio frequency coil 110. In some embodiments, an input end of the preamplifier 130 may be connected to an output end of the transmission line 120. In some embodiments, the preamplifier 130 may provide gain to the magnetic resonance signal and amplify the magnetic resonance signal. More descriptions regarding the preamplifier 130 may be found in FIGS. 3 and 6 below and the related descriptions thereof.

In some embodiments, the surface coil 100 may further include a transmission device. The transmission device may be connected to a signal output end of the preamplifier 130. The transmission device may transmit the magnetic resonance signal to a system interface of a magnetic resonance device or transmit the magnetic resonance signal to other devices. In some embodiments, the transmission device may include a radio frequency component. The signal output end of the preamplifier 130 may output the magnetic resonance signal through the radio frequency component. In some embodiments, the radio frequency component may include a communication device such as an antenna, a radio frequency front end, a radio frequency transceiver module, or a baseband signal processor. In some embodiments, the transmission device may include a plug connector. The radio frequency coil 110 may transmit the magnetic resonance signal to the system interface through the plug connector. More descriptions regarding the plug connector may be found in FIGS. 7A-7D below and the related descriptions thereof.

In some embodiments, the surface coil 100 may further include a drive circuit. The drive circuit may control the radio frequency coil 110 to switch between a tuning state and a detuning state, thereby controlling the magnetic resonance signal output by the radio frequency coil 110.

The drive circuit refers to a circuit that regulates a working state of the radio frequency coil 110. In some embodiments, when the drive circuit controls the radio frequency coil 110 to be in the tuning state, an output end of the radio frequency coil 110 may transmit the magnetic resonance signal to the preamplifier 130. When the drive circuit controls the radio frequency coil 110 to be in the detuning state, the output end of the radio frequency coil 110 may be equivalent to an open circuit, and may fail to transmit the magnetic resonance signal to the preamplifier 130.

In some embodiments, the drive circuit may include a switching device such as a diode or a field effect transistor. More descriptions regarding the drive circuit may be found in FIG. 5 below.

In the embodiments of the present disclosure, the surface coil 100 may realize the impedance matching of the circuit only by setting up the flexible transmission line 120, and there may be no need to additionally set up the rigid discrete radio frequency device (e.g., the PCB and the electronic component configured to perform tuning and impedance matching). The radio frequency coil 110 may also efficiently acquire the magnetic resonance signal, which may ensure that the surface coil 100 is flexible and has a good degree of fit with the surface of the imaging target body, avoiding the human tissue that is fit to the surface coil 100 from being squeezed and deformed, reducing the deformation of the radio frequency field (B1 field), and improving the imaging quality.

An exemplary surface coil 100 is provided below, which illustrates a specific implementation of the one coil unit 112 (i.e., a single-channel coil).

Figure 3:
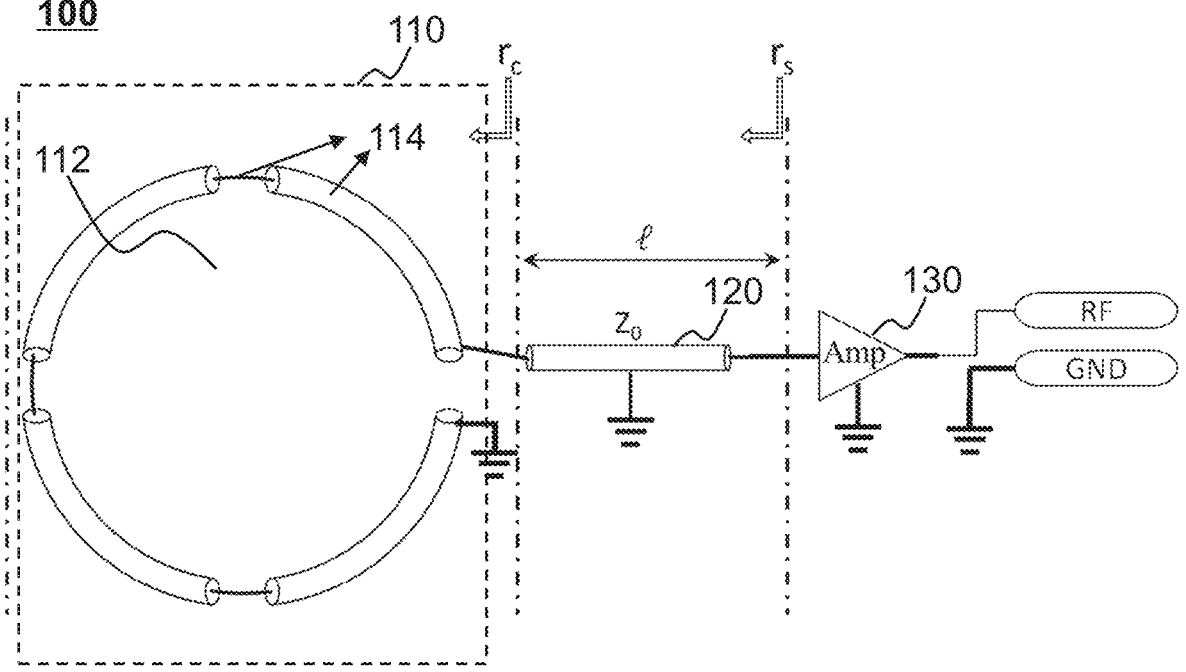
FIG. 3 is a schematic diagram illustrating a circuit structure of a surface coil according to some embodiments of the present disclosure.

FIG. 3 is a schematic diagram illustrating a circuit structure of the surface coil 100 according to some embodiments of the present disclosure. In some embodiments, as shown in FIG. 3, the flexible conductive wire 111 may include at least one tuning transmission segment 114, and the at least one tuning transmission segment 114 may be equivalent to a tuning capacitor and/or a tuning inductance. In some embodiments, a surface of the tuning transmission segment may be a L-C resonance state by adjusting tuning transmission segments.

In the embodiments of the present disclosure, the tuning transmission segment 114 equivalent to the capacitance and/or inductance may be disposed in the flexible conductive wire 111, so that there may be no need to additionally dispose discrete capacitors and/or inductors in the radio frequency coil 110, which may improve the degree of softness of the imaging region where the radio frequency coil 110 is located to provide a good degree of fit with the surface of the imaging target body and improve the imaging quality.

In some embodiments, the flexible conductive wire 111 may include a core wire and a ground wire. The tuning transmission segment 114 may include a first tuning transmission segment 114-1 equivalent to the capacitance and/or a second tuning transmission segment 114-2 equivalent to the inductance. The core wire in the first tuning transmission segment 114-1 may be conducted, and the ground wire may be disconnected. The core wire in the second tuning transmission segment 114-2 may be disconnected, and the ground wire may be conducted.

An exemplary coaxial wire and an exemplary microstrip wire are provided below, respectively, which illustrates in detail the implementation of the first tuning transmission segment 114-1 and the implementation of the second tuning transmission segment 114-2.

Figure 4A:
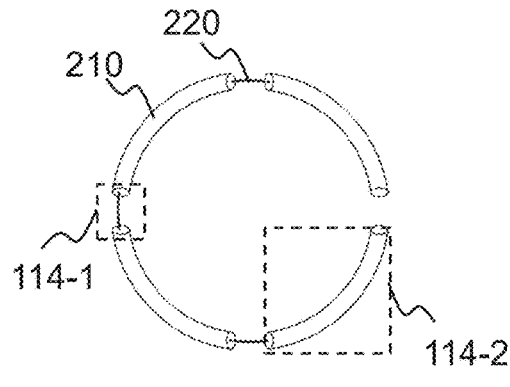
FIG. 4A is a schematic diagram illustrating a structure of an exemplary coaxial wire as a radio frequency coil according to some embodiments of the present disclosure.
Figure 4B:
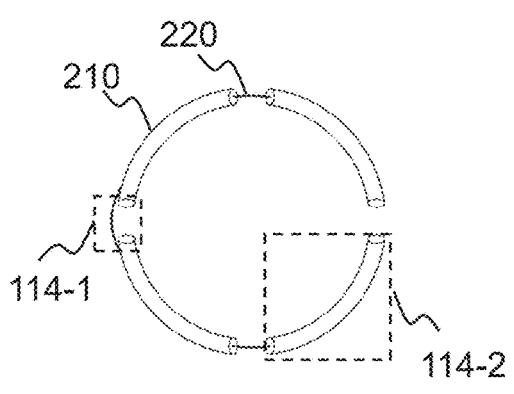
FIG. 4B is a schematic diagram illustrating a structure of an exemplary coaxial wire as a radio frequency coil according to some embodiments of the present disclosure.

FIG. 4A is a schematic diagram illustrating a structure of an exemplary coaxial wire as a radio frequency coil 110 according to some embodiments of the present disclosure. FIG. 4B is a schematic diagram illustrating a structure of an exemplary coaxial wire as a radio frequency coil according to some embodiments of the present disclosure. Taking the coaxial wire shown in FIG. 4A and FIG. 4B as an example, the ground wire 210 in the coaxial wire is disposed outside the core wire 220. The core wire 220 in the first tuning transmission segment 114-1 in the coaxial wire may be conducted, and the ground wire 210 may be disconnected, so that the first tuning transmission segment 114-1 may be equivalent to a capacitance. The core wire 220 in the second tuning transmission segment 114-2 in the coaxial wire may be disconnected, and the ground wire 210 may be conducted, so that the second tuning transmission segment 114-2 may be equivalent to an inductance.

Figure 4C:
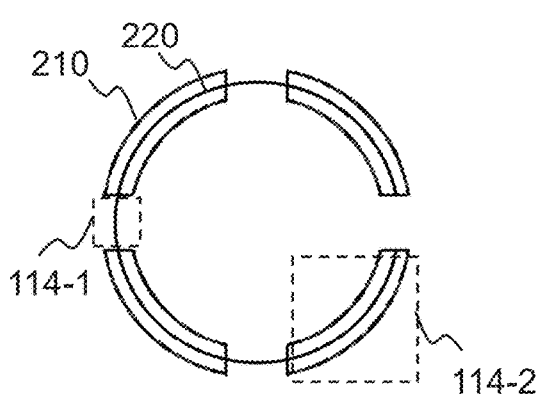
FIG. 4C is a schematic diagram illustrating a structure of an exemplary microstrip wire as a radio frequency coil according to some embodiments of the present disclosure.
Figure 4D:
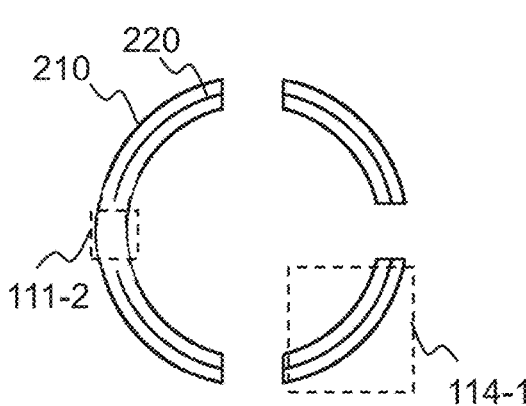
FIG. 4D is a schematic diagram illustrating a structure of an exemplary microstrip wire as a radio frequency coil according to some embodiments of the present disclosure.

FIG. 4C is a schematic diagram illustrating a structure of an exemplary microstrip wire as a radio frequency coil 110 according to some embodiments of the present disclosure. FIG. 4D is a schematic diagram illustrating a structure of an exemplary microstrip wire as a radio frequency coil 110 according to some embodiments of the present disclosure. Taking the microstrip wire shown in FIG. 4C and FIG. 4D as example, the ground wire 210 in the microstrip wire is disposed outside the core wire 220. In the microstrip wire shown in FIG. 4C, the core wire 220 in the first tuning transmission segment 114-1 may be conducted, and the ground wire 210 may be disconnected, so that the first tuning transmission segment 114-1 may be equivalent to a capacitance. The ground wire 210 in the second tuning transmission segment 114-2 may be conducted, and the core wire 220 may be electrically disconnected without data transmission, so that the second tuning transmission segment 114-2 may be equivalent to an inductance. In the microstrip wire shown in FIG. 4D, the core wire 220 in the first tuning transmission segment 114-1 may be conducted, and the ground wire 210 may be electrically disconnected without data transmission, so that the first tuning transmission segment 114-1 may be equivalent to the capacitance. The ground wire 210 in the second tuning transmission segment 114-2 may be conducted, and the core wire 220 may be disconnected, so that the second tuning transmission segment 114-2 may be equivalent to the inductance.

In some embodiments, the ground wire 210 may be disposed outside the core wire 220. As shown in the first tuning transmission segment 114-1 in FIG. 4A, the core wire 220 is threaded out of the ground wire 210. As shown in the second tuning transmission segment 114-2 in FIG. 4C and the first tuning transmission segment 114-1 in FIG. 4D, the ground wire 210 may wrap around the core wire 220. Further, in some embodiments, the core wire 220 may be threaded out of a surface of the ground wire 210 to adjust a length of the first tuning transmission segment 114-1. As shown in the first tuning transmission segment 114-1 in FIG. 4B, the core wire 220 may be threaded out from the surface of the ground wire 210. The length of the first tuning transmission segment 114-1 may be controlled by adjusting threading positions of the core wire 220. In some embodiments, as shown in FIGS. 4A-4D, the first tuning transmission segment 114-1 and the second tuning transmission segment 114-2 in series in the flexible conductive wire 111 may be equivalent to the capacitance and the inductance in series, so that the flexible conductive wire 111 of the radio frequency coil 110 may be equivalent to an L-C series resonant circuit. Accordingly, in some embodiments, the resonant frequency of the equivalent L-C resonant circuit may be controlled by changing counts and/or positions of the first tuning transmission segment 114-1 and the second tuning transmission segment 114-2 to achieve the tuning of the radio frequency coil 110.

Compared with the traditional coil array soldered on the PCB, the conductor in the PCB may be easy to follow the changing current in the imaging region to generate an induced current, which may seriously generate an eddy current that affects the imaging region. The radio frequency coil disclosed in the present disclosure 110 may be designed with the composite flexible conductive wire 111 (e.g., a coaxial wire, a microstrip wire, or a twisted pair wire), which may be electromagnetically isolated by wrapping the core wire 220 through the ground wire 210, thereby reducing the possibility of the eddy current and improving the imaging quality. The reduction in strength of the eddy current may also reduce an effect on a magnetic field of a gradient coil.

In some embodiments, the transmission line 120 may also include a core wire and a ground wire. In some embodiments, the transmission line 120 may also include a coaxial wire, a microstrip wire, or a twisted pair wire, and may include other composite flexible conductive wires 111 having a plurality of wires (e.g., a core wire and a ground wire). In some embodiments, a same type of wire may be selected as the transmission line 120 and the tuning transmission segment 114 in the coil unit 112. As shown in FIG. 1, the coaxial wire may be selected as the transmission line 120 and the tuning transmission segment 114. In some embodiments, different types of wires may be selected as the transmission line 120 and the tuning transmission segment 114, for example, the coaxial wire may be selected as the transmission line 120, and the microstrip wire may be selected as the tuning transmission segment 114.

Figure 5:
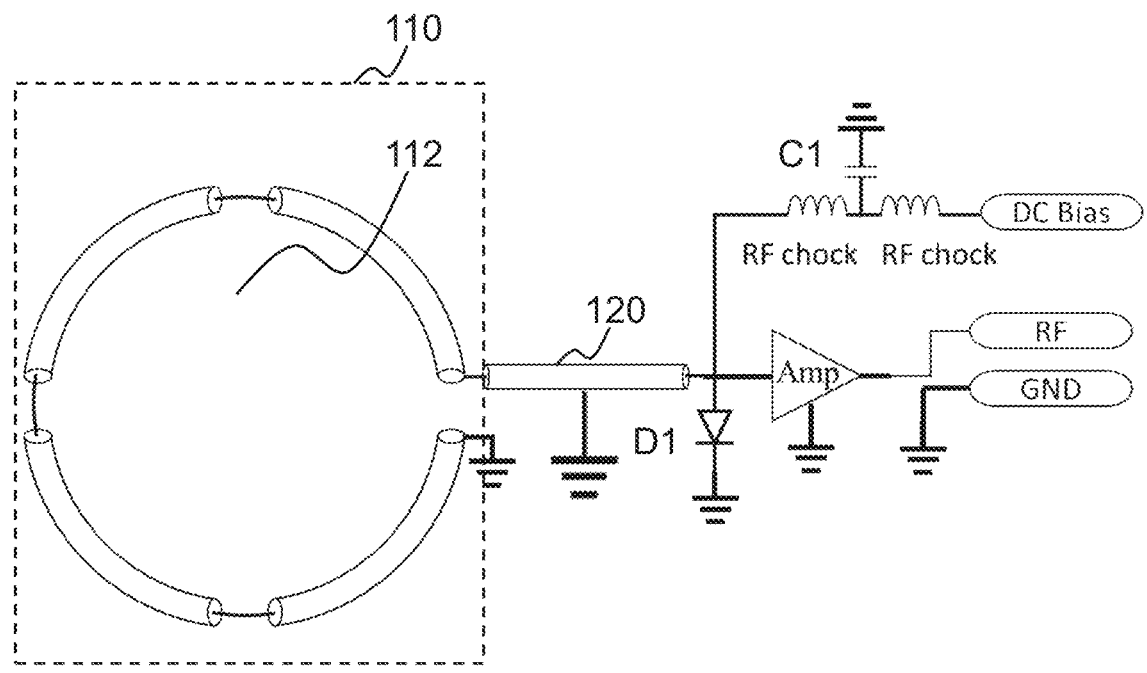
FIG. 5 is a schematic diagram illustrating an exemplary tuning and detuning surface coil according to some embodiments of the present disclosure.

In some embodiments, the coil unit 112 may be connected to the transmission line 120 in various ways. In some optional embodiments, the core wire of the coil unit 112 located at an output end may be connected to the core wire of the transmission line 120. The ground wire of the coil unit 112 located at an output end may be connected to the ground wire of the transmission line 120, or the ground wire of the coil unit 112 located at an output end and the ground wire of the transmission line 120 may be grounded. The ground wire of the coil unit 112 located at an end away from the output end may be grounded or may be connected to the ground wire of the transmission line 120. In some optional embodiments, as shown in FIG. 5 below, the ground wire of the coil unit 112 located at the output end may be connected to the core wire of the transmission line 120. The ground wire of the transmission line 120 may be connected to the ground wire of the coil unit 112 located at the end away from the output end, or the ground wire of the transmission line 120 and the ground wire of the coil unit 112 located at the end away from the output end may be grounded. Accordingly, in some embodiments, the ground wire of the coil unit 112 located at the end away from the output end may be grounded or may be connected to the ground wire of the transmission line 120.

In some embodiments, the transmission line 120 may transmit the magnetic resonance signal to the preamplifier 130. Moreover, the transmission line 120 may also be configured for impedance matching between the coil unit 112 and the preamplifier 130 to improve a signal-to-noise ratio of the magnetic resonance signal. In some embodiments, the transmission line 120 may have a characteristic impedance by designing a physical characteristic (e.g., dielectric constant or thickness) of the transmission line 120, which may achieve the impedance matching.

In some embodiments, the length of the transmission line 120 may be an odd multiple of a quarter wavelength, and a wavelength may be a wavelength of a signal (e.g., a magnetic resonance signal) that is transmitted in the transmission line 120 to achieve the impedance matching between the radio frequency coil 110 and the preamplifier 130. The length of the transmission line 120 may be an electrical length of the transmission line 120 for transmitting the signal.

In the embodiments of the present disclosure, the length of the transmission line 120 may be designed, which may realize that the transmission line 120 achieves the impedance matching between the radio frequency coil 110 and the preamplifier 130, thereby reducing the reflection of the magnetic resonance signal during transmission and improving the transmission efficiency of the magnetic resonance signal.

Continue to refer to FIG. 3, one end of the transmission line 120 may be connected to an output end of the flexible conductive wire 111, and another end of the transmission line 120 may extend out of the radio frequency coil 110 and may be connected to the preamplifier 130. The transmission line may perform impedance transformations between the connected coil and the preamplifier. For the preamplifier 130 an input impedance located before a signal input end of the preamplifier 130 may be source impedance $r_s$. In some embodiments, a relationship between the input impedance $r_s$ located before the signal input end of the preamplifier 130, the length $\ell$ of the transmission line 120, and the characteristic impedance $z_0$ of the transmission line 120 may be as shown in the following equation (1):

$$r_s = Z_0 \frac{r_c + jZ_0\tan\frac{2\pi}{\lambda}\ell}{Z_0 + jr_c\tan\frac{2\pi}{\lambda}\ell}, \tag{1}$$

where $r_s$ denotes the output impedance located before the signal input end of the preamplifier 130 (i.e., the input impedance $r_s$ of the surface coil 100), $r_c$ denotes the output impedance of the radio frequency coil 110, $\ell$ denotes the length of the transmission line 120, $z_0$ denotes the characteristic impedance of the transmission line 120, and $\lambda$ denotes the wavelength of the magnetic resonance signal. In some embodiments, where the length of the transmission line 120 is an odd multiple of ¼ wavelength $\lambda$, the above equation (1) may be derived as:

$$r_s = \frac{Z_0^2}{r_c}, \tag{2}$$

according to the above equation (2), it may be known that when the length of the transmission line 120 is an odd multiple of ¼ wavelength $\lambda$, the characteristic impedance $z_0$ of the transmission line 120 may be a geometric mean of the input impedance $r_s$ located before the signal input end of the preamplifier 130 and the output impedance $r_c$ of the radio frequency coil 110. That is, the output impedance $r_c$ of the radio frequency coil 110 may be transformed to the input impedance $r_s$ by adjusting the characteristic impedance $z_0$ of the transmission line 120. The preamplifier may achieve a maximum SNR when the input impedance $r_s$ is equal to optimum source impedance of the preamplifier. In the embodiments of the present disclosure, the impedance matching of the circuit may be achieved through the design of the flexible transmission line 120, and the radio frequency coil may be selected through a portion (e.g., the tuning transmission segment 114) of the flexible conductive wire 111 of the radio frequency coil 110, so that the surface coil 100 may not need to be provided with the additional rigid discrete radio frequency device (e.g., the PCB and the electronic component configured to perform tuning and impedance matching), which may ensure that the surface coil 100 is flexible and has a good degree of fit with the surface of the imaging target body, avoid the human tissue that is fit to the surface coil 100 from being squeezed and deformed, reduce the deformation of the radio frequency field (B1 field), and improve the imaging quality. Furthermore, the surface coil 100 provided by the embodiments of the present disclosure may be snugly fitted to a curved region (e.g., thyroid and carotid artery regions), which is conducive to the imaging of curved anatomical structures in magnetic resonance applications.

In some embodiments, the surface coil 100 may also include a phase shifter. An equivalent electrical length of the transmission line 120 and the phase shifter may be an odd multiple of a quarter wavelength. A wavelength may be a wavelength of the signal transmitted in the transmission line 120.

The phase shifter refers to a device that adjusts a phase of a signal. In some embodiments, the phase shifter may be disposed at an output end of the transmission line 120 to adjust the phase of the signal in the transmission line 120, thereby adjusting the equivalent electrical length of the transmission line 120 and the phase shifter to achieve the impedance matching of the circuit.

In some embodiments, the equivalent electrical length of the transmission line 120 may also be adjusted in various ways, for example, by setting capacitance and/or inductance, so that the electrical length of the transmission line 120 may be maintained as an odd multiple of a quarter wavelength to achieve the impedance matching of the circuit.

In the embodiments of the present disclosure, the phase shifter may be disposed, which may adjust the equivalent electrical length of the transmission line 120, thereby reducing the quality requirement of the transmission line 120 and reducing the cost overhead of the surface coil 100.

In some embodiments, the drive circuit may include at least one diode. The radio frequency coil 110 may be controlled to be in a detuning state through conduction of the at least one diode, or the radio frequency coil 110 may be controlled to be in a tuning state through disconnection of the at least one diode. A positive pole of the at least one diode may be connected to an output end of the transmission line 120 and the signal input end of the preamplifier 130, and a negative pole of the diode may be grounded.

In some optional embodiments, the drive circuit may further include a voltage source coupled with the diode. The voltage source may be configured to provide a positive voltage to control the diode to be conducted. The voltage source may be further configured to provide a negative voltage to control the diode to be disconnected.

The detuning state refers to a state in which the coil is disabled from resonance, and the tuning state refers to a state in which the coil is in resonance. In some embodiments, when the radio frequency coil 110 is in the detuning state, the magnetic resonance signal may not be output. When the radio frequency coil 110 is in the tuning state, the magnetic resonance signal may be output normally.

FIG. 5 is a schematic diagram illustrating an exemplary tuning and detuning surface coil 100 according to some embodiments of the present disclosure. As shown in FIG. 5, the surface coil 100 may further include a diode D1 (i.e., the diode) and a DC Bias (i.e., the voltage source). The DC Bias may be coupled with the diode D1. A positive pole of the diode D1 may be connected to a signal output end of the transmission line 120 and a signal input end of the preamplifier 130. The negative pole of the diode D1 may be grounded. When the DC Bias is supplied in a reverse direction, the DC Bias may provide a negative voltage, so that the diode D1 may be in a disconnection state equivalent to an open circuit, and the radio frequency coil 110 may be in the tuning state and a magnetic resonance signal may be output. Accordingly, the preamplifier 130 may receive the magnetic resonance signal. When the DC Bias is supplied in a positive direction, the DC Bias may provide a positive voltage, so that the diode D1 may be in a conduction state equivalent to a short circuit. The radio frequency coil 110 at an output end may be equivalent to a large impedance (e.g., impedance $$\frac{z_0^2}{0},$$

where $z_0$ denotes the impedance of the transmission line 120), which may be close to a broken circuit, and the radio frequency coil 110 may be in the detuning state, and the magnetic resonance signal may not be output. Accordingly, the preamplifier 130 may fail to receive the magnetic resonance signal.

In some embodiments of the present disclosure, the diode (e.g., diode D1) may be driven to be disconnected or conducted by controlling the direction of power supply of the voltage source (e.g., DC Bias), which may realize switching control of the tuning state and the detuning state of the radio frequency coil 110, thereby regulating the magnetic resonance signal output by the radio frequency coil 110.

In some embodiments, as shown in FIG. 5, the DC Bias may be coupled with the diode D1 through two radio frequency chokes (RF chock), and the RF chokes may be configured to suppress high-frequency noise in the circuit. In some embodiments, the two RF chokes may also be grounded by a capacitor C1, and the capacitor C1 may be configured to filter out noise and fluctuations in the circuit.

In some embodiments, the surface coil 100 may further include a mounting layer and a cladding layer. The mounting layer and the cladding layer may be flexible. The radio frequency coil 110 may be disposed on the mounting layer, and the cladding layer may be disposed on the mounting layer and at least may clad the radio frequency coil 110. The mounting layer and the cladding layer may penetrate through the surface coil 100 along a thickness direction of the surface coil 100 and form a hollow structure. In some embodiments, the mounting layer and the cladding layer may include a flexible material such as leather (e.g., polyurethane leather), fabric (e.g., polyester fabric), or the like, or any combination thereof.

In the embodiments of the present disclosure, the cladding layer may form an outer skin that clads a coil assembly. The hollow structure may be formed on the mounting layer and the cladding layer, and the hollow structure may facilitate heat dissipation from the surface coil 100 during use. Moreover, through the hollow structure on the mounting layer and the cladding layer, the radio frequency coil 110 may be spatially secured without an additional rigid component, which may ensure the air permeability of the surface coil 100 and increase the flexibility of the surface coil 100, so that the surface coil 100 may be further fit to the human tissue.

In some embodiments, the surface coil 100 may also include an edge sealing structure in a shape of a ring. The edge sealing structure may be disposed along an edge of the hollow structure. The edge sealing structure may include a sealing part, a bonding zone, and a sewing part. The bonding zone may surround outside the edges of the hollow structure and bond the cladding layer and the mounting layer. The sealing part may be disposed along an inner edge of the hermetically and may be hermetically connected to the cladding layer and the mounting layer. The sewing part may be disposed along an outer edge of the hermetically and sew the cladding layer and the mounting layer.

In some embodiments, the bonding zone may be understood as the mounting layer being bonded to the cladding layer in a ring-shaped region, and the bonding zone may be configured to bond a gap between the mounting layer and the cladding layer at the hollow structure. In addition, the bonding zone may also provide a relatively flat operating region for a subsequent process (e.g., a sewing operation or a sealing operation).

In some embodiments, the sealing part may be disposed along the inner edge of the bonding zone and hermetically connected to the cladding layer and the mounting layer. The sealing part may be understood as a structure that seals the gap between the mounting layer and the cladding layer at the hollow structure. Through the hermetical connection between the sealing part and the cladding layer and the mounting layer, the sealing part may seal the gap between the mounting layer and the cladding layer at the hollow structure completely, and also may further connect and fix the mounting layer and the cladding layer on the inner edges of the bonding zone, thereby ensuring that the mounting layer and the cladding layer on the inner edge of the bonding zone, and ensuring the stability of the bonding zone.

In some embodiments, the sewing part may be disposed along an outer edge of the bonding zone and sew the cladding layer and the mounting layer. The sewing part may be understood as a structure formed by sewing the mounting layer and the cladding layer with a thread along the outer edge of the bonding zone. The sewing part may have the effect of further tightening the connection between the cladding layer and the mounting layer. Additionally, since the surface coil 100 may be bent frequently in use, the adhesive force and structural strength of the bonding zone may not be sufficient, and the sewing thread of the sewing part disposed along the outer contour of the bonding zone may share a force generated by the pulling of the cladding layer of the surface coil 100 during bending, thereby increasing the adhesive force and structural strength of the bonding zone and ensuring the bonding stability of the bonding zone.

In the embodiments of the present disclosure, even though the hollow structure is disposed, due to the setting of the edge sealing structure, the edge sealing structure may, on the one hand, strengthen the structural strength of the surface coil 100, and, on the other hand, hermetically connect the mounting layer to the cladding layer at the hollow structure, which may ensure that the radio frequency coil 110 is isolated from an external environment to enable the radio frequency coil 110 to work safely and stably.

The edge sealing structure of a sealing process, a bonding process, and a sewing process may be disposed, so that the cladding layer and the mounting layer may be used as a smooth and seamless whole, which may ensure the structural strength of the hollow radio frequency coil 110 inside the surface coil 100. The edge sealing structure may make the surface of the surface coil 100 locally and smoothly concave, reduce a non-essential contact area with the human tissue, enhance the heat dissipation performance, and improve the wearing comfort of the surface coil 100. Therefore, the surface coil 100 of the present disclosure may have a good heat dissipation performance and a high structural strength, and may also work safely and stably.

Another exemplary surface coil 100 is provided below, which illustrates in detail a specific implementation of the coil unit 112 (i.e., a single-channel coil).

Figure 6:
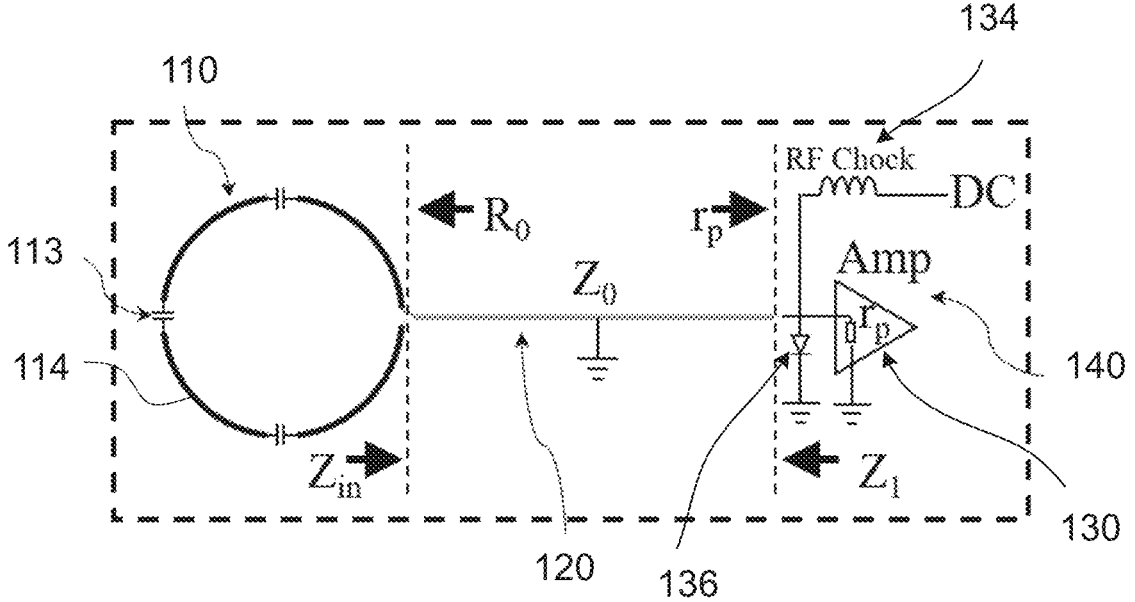
FIG. 6 is a schematic diagram illustrating a circuit structure of a surface coil according to other embodiments of the present disclosure.

FIG. 6 is a schematic diagram illustrating of a circuit structure of the surface coil 100 according to other embodiments of the present disclosure. In some embodiments, as shown in FIG. 6, the coil unit 112 may include a plurality of tuning capacitors 113 connected in series through the flexible conductive wire 111. The surface coil 100 may further include a regulating control unit. The regulating control unit may be connected to another end of the transmission line 120. The regulating control unit may regulate the radio frequency coil 110 to enter a tuning state or a detuning state according to the received DC signal.

In some embodiments, the tuning capacitor 113 may serve a similar function as the tuning transmission segment 114, and may perform the function of accommodating and releasing charge and receiving the magnetic resonance signal to adjust a resonant frequency of the coil unit 112. That is, the tuning capacitor 113 may adjust the resonant frequency of the radio frequency coil 110, so that the radio frequency coil 110 may be close to the frequency of the magnetic resonance signal, thereby realizing the tuning of the radio frequency coil 110.

In some embodiments, the coil unit 112 may be bent in a set direction to form a connecting end to connect the transmission line 120 to form a corresponding loop.

In some embodiments, the transmission line 120 may be implemented in the form of an impedance converter to adjust the transmission line 120 to perform an impedance conversion on the radio frequency coil 110. It should be noted that due to a property (referred to as the impedance I/4 transformability) that a product of an input impedance of two points I/4 apart on the transmission line 120 is equal to a constant, the impedance transformation may be performed using the transformation of the wavelength of the transmission line 120, and the transmission line 120 may play a role of impedance transformation and may transform a capacitive (inductive) impedance into an inductive (capacitive) impedance by I/4.

In some embodiments, as shown in FIG. 6, the surface coil 100 may further include the preamplifier 130. An input end of the preamplifier 130 may be connected to another end of the transmission line 120. More descriptions regarding the preamplifier 130 may be found in FIG. 5 and the related descriptions thereof.

The regulating control unit similar to the drive circuit refers to a circuit unit that regulates a working state of the radio frequency coil 110. In some embodiments, the regulating control unit may regulate a state of the coil unit 112 according to a DC signal. For example, in a radio frequency pulse transmission stage, the regulating control unit may regulate the coil unit 112 to enter a detuning state according to the DC signal to ensure that the coil unit 112 may not be damaged. If the radio frequency pulse is transmitted, the regulating control unit may regulate the coil unit 112 to enter the tuning state according to the DC signal. More descriptions regarding the regulating control unit may be found in the related descriptions below.

In the embodiment of the present disclosure, the regulating control unit may be pulled out of the imaging region through the transmission line 120, so that the regulating control unit may be disposed outside the imaging region, thereby reducing the influence of various components of the regulating control unit on an emission field in the imaging region, avoiding the formation of image artifacts, improving the safety of the magnetic resonance, facilitating the improvement of the degree of fit between the radio frequency coil 110 and a surface of a part to be imaged, and improving the imaging quality. Moreover, the structure of the radio frequency coil 110 is simple, and merely the coil unit 112 is configured to be fit to the surface of the part to be imaged, which is light in weight, so that the degree of fit of the coil may be improved.

In some embodiments, as shown in FIG. 6, the regulating control unit may include a radio frequency choke 134. One end of the radio frequency choke 134 is configured to receive the DC signal, and another end of the radio frequency choke 134 may be connected to another end of the transmission line 120. The radio frequency choke 134 may prevent the high-frequency signal from entering the radio frequency coil 110.

In some embodiments, the magnetic resonance device 10 may also include a component such as a main magnet, a gradient coil, a control device, a spectrometer, a hospital bed, or the like, or any combination thereof. In some embodiments, a type of magnetic resonance device 10 may include a magnetic resonance imaging (MRI) device, a nuclear magnetic resonance (NMR) device, a magnetic resonance spectroscopy (MRS) device, a magnetic resonance spectroscopy imaging (MRSI) device, or any combination thereof. In some embodiments, the magnetic resonance device 10 may identify different chemical compositional spectral components using a chemical displacement difference of different magnetic resonance signals and output the image information corresponding to the magnetic resonance signals.

It should be noted that the surface coil 100 may be applied not only to the magnetic resonance device 10, but also to other systems that need to capture signals. For example, the surface coil 100 may be applied to a geological exploration device to obtain a plurality of magnetic resonance signals to determine geological distribution information that corresponds to the magnetic resonance signals. As another example, the surface coil 100 may be applied to a chemical substance analysis device to obtain the plurality of magnetic resonance signals returned by a substance to be analyzed to determine information such as the composition or distribution of the substance corresponding to the magnetic resonance signals.

In some embodiments, the magnetic resonance device 10 may further include a plug connector 140, and the surface coil 100 may be connected to a system interface of the magnetic resonance device 10 through the plug connector 140. The system interface refers to a signal receiving terminal of the magnetic resonance device 10. The system interface may transmit the received magnetic resonance signal to a processor of the magnetic resonance device for signal processing.

In some embodiments, the preamplifier 130 may be disposed between the plug connector and the transmission line 120 or the preamplifier 130 may be disposed at the system interface. A plurality of exemplary plug connectors are provided below, respectively, which illustrate in detail specific implementations of the preamplifier 130.

Figure 7A:
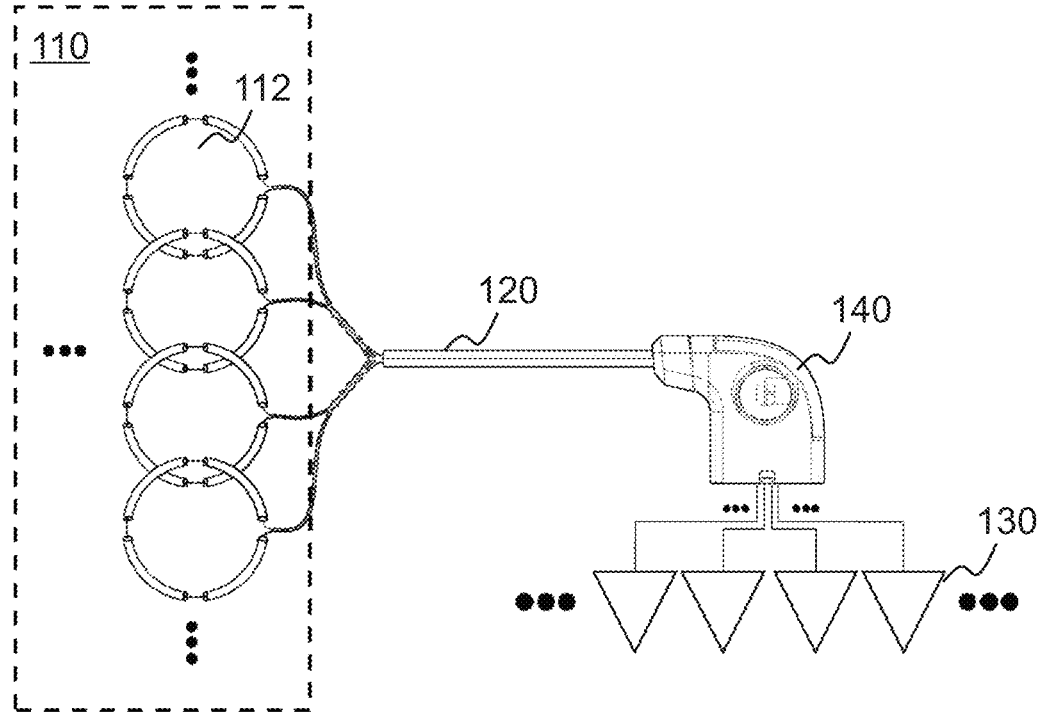
FIG. 7A is a schematic diagram illustrating a circuit structure of an exemplary first plug connector according to some embodiments of the present disclosure.
Figure 7B:
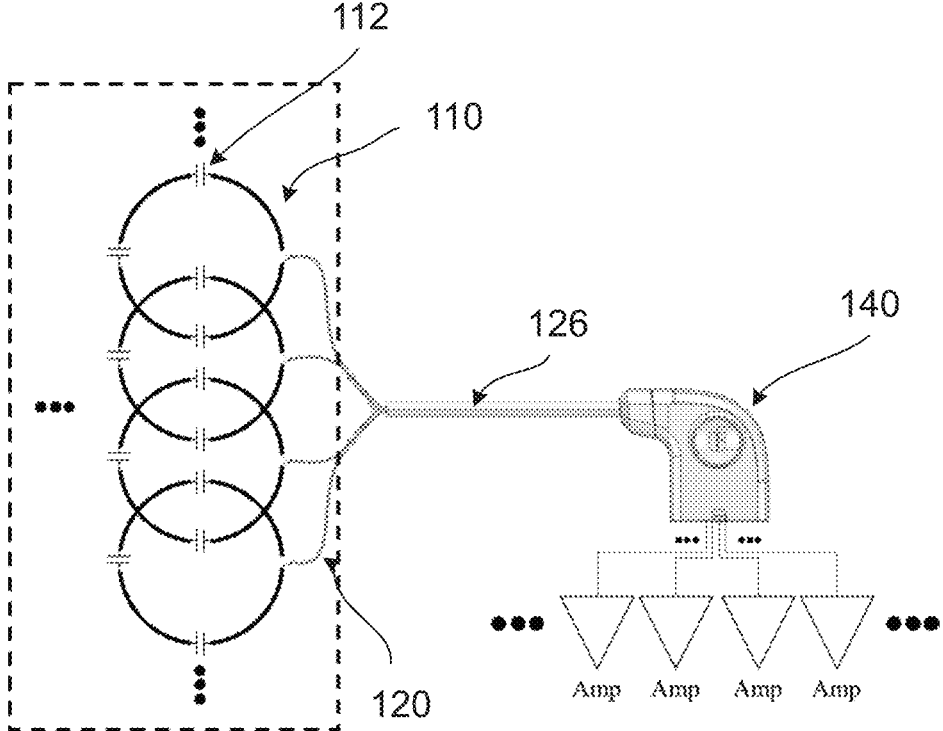
FIG. 7B is a schematic diagram illustrating a circuit structure of an exemplary first plug connector according to other embodiments of the present disclosure.

FIG. 7A is a schematic diagram illustrating a circuit structure of an exemplary first plug connector according to some embodiments of the present disclosure. FIG. 7B is a schematic diagram illustrating a circuit structure of an exemplary first plug connector according to other embodiments of the present disclosure. In some optional embodiments, as shown in FIG. 7A and FIG. 7B, the plug connector 140 may be connected between the transmission line 120 of the surface coil 100 and a signal input end of the preamplifier 130. Accordingly, the preamplifier 130 may be disposed on the system interface or other devices to increase the flexibility of the surface coil 100. Further, in some embodiments, the preamplifier 130 may be disposed on the system interface and outside an imaging region. An electrical length of the transmission line 120 and the plug connector may be an odd multiple of a quarter wavelength to achieve the impedance matching between the radio frequency coil 110 and the preamplifier 130.

In the embodiment of the present disclosure, the preamplifier 130 may be disposed on the system interface, which may ensure the function of the surface coil 100 and further enhance the degree of fit between the surface coil 100 and the human body, thereby enhancing a signal-to-noise ratio of the image output by the system interface.

Figure 7C:
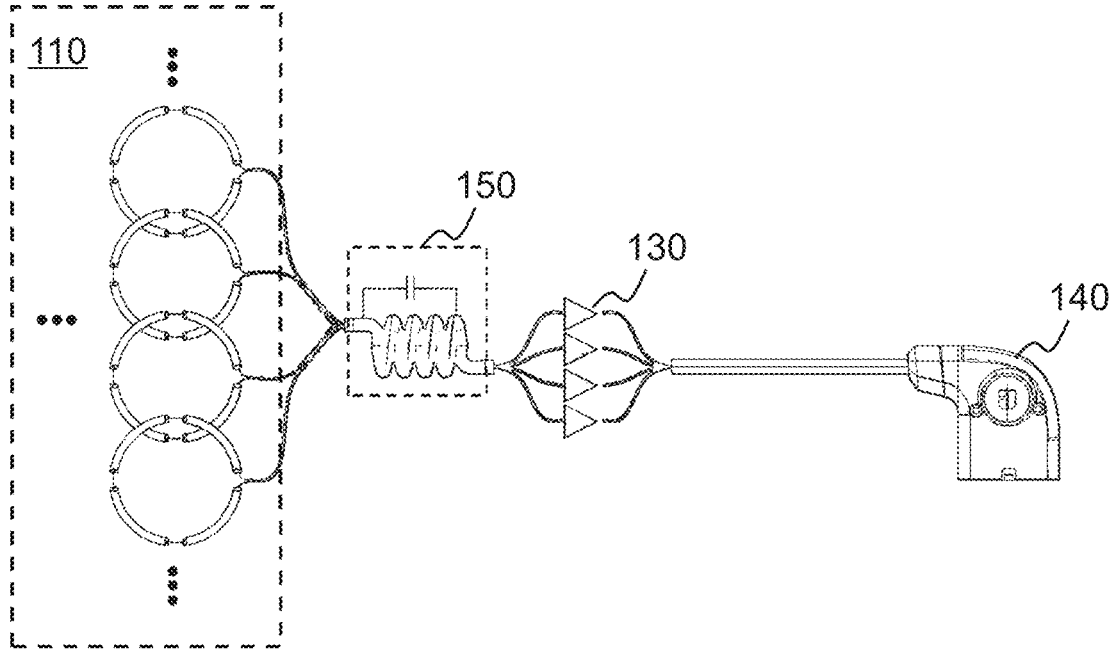
FIG. 7C is a schematic diagram illustrating a circuit structure of an exemplary second plug connector according to some embodiments of the present disclosure.
Figure 7D:
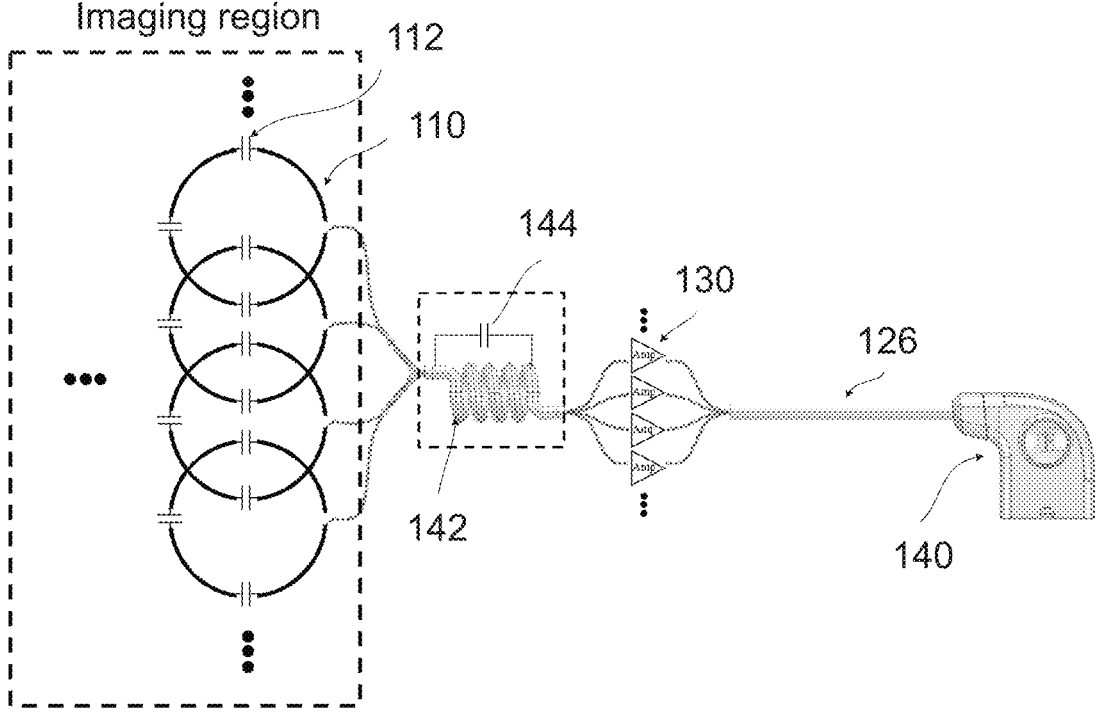
FIG. 7D is a schematic diagram illustrating a circuit structure of an exemplary second plug connector according to other embodiments of the present disclosure.

FIG. 7C is a schematic diagram illustrating a circuit structure of an exemplary second plug connector according to some embodiments of the present disclosure. FIG. 7D is a schematic diagram illustrating of a circuit structure of an exemplary second plug connector according to other embodiments of the present disclosure. In some optional embodiments, the plug connector 140 may be connected to a signal output end of the preamplifier 130 of the surface coil 100. Accordingly, the preamplifier 130 may be disposed on the surface coil 100.

In the embodiment of the present disclosure, the preamplifier 130 may be disposed in the surface coil 100, so that the magnetic resonance signal may be amplified and processed in time, and the interference of the ambient noise may be reduced, thereby improving the accuracy of the magnetic resonance signal.

In some embodiments, as shown in FIGS. 7A-7D, the coil unit 112 may include a plurality of coil units, and each coil unit 112 may form an array structure. Accordingly, the surface coil may include a plurality of transmission lines 120. One end of each transmission line of the plurality of transmission lines 120 may be connected to an output end of each coil unit 112 in a one-to-one correspondence. The plurality of transmission lines 120 may be configured to transmit the magnetic resonance signals acquired by the coil units 112. The surface coil may include a plurality of regulating control units. Each regulating control unit of the plurality of regulating control units may be connected to another end of each transmission line 120 in a one-to-one correspondence. Each regulating control unit may be configured to regulate the coil unit 112 corresponding to each regulating control unit to enter a tuning state or a detuning state according to the corresponding DC signal. The surface coil may include a plurality of preamplifiers 130. An end of each preamplifier of the plurality of preamplifiers 130 may be connected to the another end of the each transmission line 120 in a one-to-one correspondence. An output end of the each preamplifier 130 may be connected to an input end of the plug connector 140.

In some embodiments, a count of coil units 112 may be set according to the demand. The plurality of coil units 112 may be arranged in the imaging region according to the demand. The each coil unit 112 may form the array structure to improve the imaging signal-to-noise ratio. For example, the each coil unit 112 may be distributed in an overlapping form to uniformly acquire the magnetic resonance signal of a target object (e.g., human tissue), so that an external device connected to the surface coil 100 may realize the imaging of a corresponding part of the target object in the imaging region based on the received magnetic resonance signals.

In some embodiments, each coil unit 112 may include 3 tuning capacitors 113 connected in series. The coil units 112 may be bent in a set direction to form a connection end to connect the corresponding transmission line 120 to form a corresponding loop. Each coil unit 112 may be made of a flexible material, and the radio frequency coil 110 may include a flexible housing for accommodating the each coil unit 112, which may be bent into various shapes to be fully fit to the part to be imaged. More descriptions regarding the coil units 112 may be found in FIGS. 3-6 above and the related descriptions thereof.

In some embodiments, the transmission lines 120 may be implemented as an impedance converter. A length of each transmission line 120 may be an odd multiple of a quarter wavelength, for example, a transmission line 120 with a length of an odd multiple of a quarter wavelength is used. It should be noted that the length is a ratio of a mechanical length (or geometric length or electrical length) of the transmission line 120 to a wavelength of an electromagnetic wave transmitted by the transmission line 120. Two adjacent transmission lines of the plurality of transmission lines 120 may be wound around each other to form a twisted pair wire, or, as shown in FIG. 2, each transmission line 120 may be a microstrip wire in a serpentine winding shape to suppress a common-mode signal. An impedance transformation module may include a plurality of shielding layers 142 covering an outer surface of the each transmission line 120 and a plurality of capacitors 144 (e.g., the capacitor 124 shown in FIG. 2) connected in parallel with the each transmission line 120 in a one-to-one correspondence. For example, a wave trap (radio frequency well) may be formed by adding metal shielding to the microstrip wire and connecting the capacitors in parallel. More descriptions regarding the transmission lines 120 may be found in FIGS. 3-6 above and the related descriptions thereof.

In some embodiments of the present disclosure, the magnetic resonance signals may be acquired through the plurality of coil units 112 in the imaging region, and the magnetic resonance signal acquired by each coil unit 112 may be transmitted to each regulating control unit respectively through the transmission line 120 corresponding to the each coil unit 112, under the action of the DC signal received by each regulating control unit, each regulating control unit may be configured to adjust the corresponding coil unit 112 to enter the tuning state or the detuning state according to the DC signal, and the adjustment control module may be pulled out of the imaging region through the impedance transformation, which may reduce the influence of the adjustment control module on the emission field of the imaging region and improve the imaging effect and safety of the radio frequency coil 110. The coil structure is simple, and merely the surface coil 100 is used to be fit to the surface of the part to be imaged, which is light in weight, so that the degree of fit of the surface coil 100 may be improved.

In some embodiments, as shown in FIG. 7C and FIG. 7D, output ends of the plurality of coil units 112 may be coupled with the plurality of preamplifiers 130 through the wave trap 150. The wave trap 150 may filter out interference in the magnetic resonance signals to improve the imaging quality. More examples of the wave trap 150 may be found in FIG. 2 and the related descriptions thereof above.

In some embodiments, the surface coil 100 may further include an insulating layer 126 and a plug connector 140. The insulating layer 126 may wrap an outer surface of the impedance transformation module. An input end of the plug connector 140 may be connected to another end of each transmission line 120, and an output end of the plug connector 140 may output the transmitted magnetic resonance signal.

In some embodiments, the insulating layer 126 may be configured to improve the safety and stability of the impedance transformation module by disposing the insulating layer 126. The insulating layer 126 may be realized using an insulating material uniformly laid on the outer surface of the impedance transformation module. The magnetic resonance signal transmitted by the each transmission line 120 of the radio frequency coil 110 may be output through the plug connector 140. More descriptions regarding the plug connector 140 may be found in FIGS. 7A-7D above.

In one embodiment, the impedance transformation module may further include a plurality of phase shifters connected in series with the plurality of transmission lines 120 in a one-to-one correspondence. The plurality of phase shifters may compensate the plurality of transmission lines 120, so that an equivalent electrical length of each transmission line may be an odd multiple of a quarter wavelength.

In some embodiments, the electrical length of the transmission line 120 may be the ratio of the mechanical length (or geometric length) of the transmission line 120 to the wavelength of the electromagnetic wave transmitted by the transmission line 120. If the electrical length of the each transmission line 120 is not equal to an odd multiple of a quarter wavelength, phase compensation of the equivalent circuit may be realized by setting the plurality of phase shifters connected in series with the plurality of transmission lines 120 in a one-to-one correspondence so that the equivalent electrical length of the each transmission line 120 may meet an odd multiple of a quarter wavelength and play the role of impedance transformation. Therefore, the magnetic resonance signal acquired by the each coil unit 112 may reach the corresponding regulation control unit as large as possible, the transmission efficiency may be improved, and the transmission loss may be reduced. Each phase shifter may be disposed between the each coil unit 112 and the each transmission line 120, or between the each transmission line 120 and the each regulation control unit. More descriptions regarding the phase shifters may be found in FIG. 3 above and the related descriptions thereof.

The basic concept has been described above. Obviously, for those skilled in the art, the above detailed disclosure is only an example, and does not constitute a limitation to the present disclosure. Although not explicitly stated here, those skilled in the art may make various modifications, improvements, and amendments to the present disclosure. These alterations, improvements, and modifications are intended to be suggested by this disclosure, and are within the spirit and scope of the exemplary embodiments of this disclosure.

Moreover, certain terminology has been used to describe embodiments of the present disclosure. For example, "one embodiment," "an embodiment," and/or "some embodiments" refer to a certain feature, structure or characteristic related to at least one embodiment of the present disclosure. Therefore, it should be emphasized and noted that references to "one embodiment" or "an embodiment" or "an alternative embodiment" two or more times in different places in the present disclosure do not necessarily refer to the same embodiment. In addition, some features, structures, or features in the present disclosure of one or more embodiments may be appropriately combined.

In addition, those skilled in the art will understand that various aspects of the present disclosure may be illustrated and described in several patentable categories or situations, including any new and useful process, machine, product, or combination of substances, or any new and useful improvements thereto. Accordingly, all aspects of the present disclosure may be performed entirely by hardware, may be performed entirely by software (including firmware, resident software, microcode, etc.), or may be performed by a combination of hardware and software. The above hardware or software can be referred to as "data block," "module," "engine," "unit," "component," or "system." In addition, aspects of the present disclosure may be presented as a computer product located in one or more computer-readable mediums, the product including computer-readable program code.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A surface coil, comprising: a radio frequency coil, a transmission line, and a preamplifier, wherein the radio frequency coil includes at least one coil unit and a flexible conductive wire, wherein the flexible conductive wire is wound into at least one loop to form the at least one coil unit, the at least one coil unit receives a magnetic resonance signal, the flexible conductive wire includes at least one tuning transmission segment, the at least one tuning transmission segment is a part of the flexible conductive wire, and the at least one tuning transmission segment is functional as a tuning capacitor;

one end of the transmission line is connected to the radio frequency coil, another end of the transmission line extends out of the radio frequency coil and is connected to the preamplifier, and the transmission line is configured to perform impedance transformations between the radio frequency coil and the preamplifier and transmit the magnetic resonance signal received by the radio frequency coil to the preamplifier; and the preamplifier receives and amplifies the magnetic resonance signal received by the radio frequency coil.

2. The surface coil of claim 1, wherein a length of the transmission line is an odd multiple of a quarter wavelength, a wavelength being a wavelength of the magnetic resonance signal transmitted in the transmission line.

3. The surface coil of claim 2, wherein a characteristic impedance of the transmission line is configured to perform impedance transformations between an output end of a coil and an input end of the preamplifier of the surface coil.

4. The surface coil of claim 1, wherein the flexible conductive wire includes at least one of a coaxial wire, a microstrip wire, or a twisted pair wire.

5. The surface coil of claim 1, wherein the flexible conductive wire includes a core wire and a ground wire, and the tuning transmission segment includes a first transmission segment equivalent to the tuning capacitor and/or a second transmission segment equivalent to the tuning inductance, wherein the core wire in the first transmission segment is conducted, and the ground wire is disconnected; or the core wire in the second transmission segment is disconnected, and the ground wire is conducted.

6. The surface coil of claim 1, wherein the at least one coil unit includes a plurality of coil units, the transmission line includes a wave trap, and output ends of the plurality of coil units are coupled with a plurality of preamplifiers through the wave trap.

7. The surface coil of claim 1, wherein the surface coil further includes at least one diode, the radio frequency coil is controlled to be in a detuning state through conduction of the at least one diode, or the radio frequency coil is controlled to be in a tuning state through disconnection of the at least one diode, a positive pole of the at least one diode is connected to an output end of the transmission line and a signal input end of the preamplifier, and a negative pole of the at least one diode is grounded.

8. The surface coil of claim 1, further comprising a mounting layer and a cladding layer, wherein the mounting layer and the cladding layer are flexible, the radio frequency coil is disposed on the mounting layer, the cladding layer is disposed on the mounting layer and at least clads the radio frequency coil, and the mounting layer and the cladding layer penetrate through the surface coil along a thickness direction of the surface coil and form a hollow structure.

9. The surface coil of claim 8, further comprising an edge sealing structure in a shape of a ring, the edge sealing structure being disposed along an edge of the hollow structure, wherein the edge sealing structure includes a sealing part, a bonding zone, and a sewing part;

the bonding zone surrounds outside the edge of the hollow structure and bonds the cladding layer and the mounting layer;

the sealing part is disposed along an inner edge of the bonding zone and is hermetically connected to the cladding layer and the mounting layer; and the sewing part is disposed along an outer edge of the bonding zone and sews the cladding layer and the mounting layer.

10. The surface coil of claim 1, wherein the radio frequency coil includes a plurality of tuning capacitors connected in series;

the surface coil further comprises a regulating control unit, the regulating control unit being connected to the another end of the transmission line; and the regulating control unit regulates the radio frequency coil to enter a tuning state or a detuning state according to a received direct current signal.

11. The surface coil of claim 10, wherein the regulating control unit includes:

a radio frequency choke, one end of the radio frequency choke receiving the direct current signal, and another end of the radio frequency choke being connected to the another end of the transmission line.

12. The surface coil of claim 10, wherein the surface coil includes a plurality of radio frequency coils, and each radio frequency coil of the plurality of radio frequency coils forms an array structure;

the surface coil includes a plurality of transmission lines, and one end of each transmission line of the plurality of transmission lines is connected to an output end of each radio frequency coil in a one-to-one correspondence; and the surface coil includes a plurality of regulating control units, and each regulating control unit of the plurality of regulating control units is connected to another end of each transmission line in a one-to-one correspondence.

13. The surface coil of claim 12, wherein two adjacent transmission lines of the plurality of transmission lines are wound around each other to form a twisted pair wire.

14. The surface coil of claim 12, wherein a length of each transmission line of the plurality of transmission lines is an odd multiple of a quarter wavelength, a wavelength being a wavelength of the magnetic resonance signal transmitted in the transmission line; and the surface coil further comprises a plurality of shielding layers covering an outer surface of the each transmission line and a plurality of capacitors connected in parallel with the each transmission line in a one-to-one correspondence.

15. The surface coil of claim 13, further comprising:

an insulating layer, the insulating layer wrapping an outer surface of the transmission line; and a plug connector, an input end of the plug connector being connected to the another end of each transmission line, and an output end of the plug connector outputting the magnetic resonance signal.

16. The surface coil of claim 15, wherein the surface coil includes a plurality of the preamplifiers, an input end of each preamplifier of the plurality of preamplifiers is connected to the another end of the each transmission line in a one-to-one correspondence; and an output end of the each preamplifier is connected to the input end of the plug connector.

17. The surface coil of claim 12, wherein the surface coil further includes a plurality of phase shifters connected in series with the plurality of transmission lines in a one-to-one correspondence, and the plurality of phase shifters compensate the plurality of transmission lines to make an equivalent electrical length of each transmission line be an odd multiple of a quarter wavelength.

* * * * *